(12) United States Patent
Huang et al.

(10) Patent No.: US 7,471,493 B1
(45) Date of Patent: Dec. 30, 2008

(54) FAST AND COMPACT SCR ESD PROTECTION DEVICE FOR HIGH-SPEED PINS

(75) Inventors: Cheng-Hsiung Huang, Cupertino, CA (US); Chih-Ching Shih, Pleasanton, CA (US); Hugh Sung-Ki O, Fremont, CA (US); Yowjuang (Bill) Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 353 days.

(21) Appl. No.: 11/365,070

(22) Filed: Feb. 28, 2006

Related U.S. Application Data

(60) Continuation-in-part of application No. 10/938,102, filed on Sep. 10, 2004, now Pat. No. 7,342,282, and a continuation-in-part of application No. 10/882,874, filed on Jun. 30, 2004, now Pat. No. 7,195,958, which is a division of application No. 10/298,104, filed on Nov. 14, 2002, now Pat. No. 6,777,721.

(51) Int. Cl.
*H02H 9/00* (2006.01)
*H02H 1/00* (2006.01)

(52) U.S. Cl. ........................................... 361/56

(58) Field of Classification Search ............... 361/56
See application file for complete search history.

(56) References Cited

U.S. PATENT DOCUMENTS

| | | | | | |
|---|---|---|---|---|---|
| 5,103,154 | A | * | 4/1992 | Dropps et al. | 318/782 |
| 5,663,860 | A | * | 9/1997 | Swonger | 361/56 |
| 5,856,904 | A | * | 1/1999 | Pelly et al. | 361/111 |
| 6,873,505 | B2 | * | 3/2005 | Chen et al. | 361/56 |

* cited by examiner

*Primary Examiner*—Ronald W Leja
(74) *Attorney, Agent, or Firm*—Morgan, Lewis & Bockius LLP

(57) ABSTRACT

A pair of SCR devices connected in antiparallel between first and second nodes. Each SCR device comprises an NPN and a PNP bipolar transistor. Reverse-biased Zener diodes are used for triggering the NPN bipolar transistor in each SCR device when it breaks down in an ESD event. Advantageously, additional Zener diodes are provided for pre-charging the PNP transistor of each SCR device at the same time, thereby reducing the delay time for turning on the PNP bipolar transistor. In addition, the breakdown current of the Zener diodes is preferably maximized by reducing the P-well and N-well resistance of the SCRs. This is achieved by connecting external resistances between the base of each bipolar transistor and the node to which the emitter of the transistor is connected.

20 Claims, 2 Drawing Sheets

FAST AND COMPACT SCR ESD PROTECTION DEVICE FOR HIGH-SPEED PINS

CROSS REFERENCE TO RELATED APPLICATIONS

This application is a continuation-in-part of application Ser. No. 10/938,102, filed Sep. 10, 2004, now U.S. Pat. No. 7,342,282 for "Compact SCR Device and Method for Integrated Circuits." It is also a continuation-in-part of application Ser. No. 10/882,874, filed Jun. 30, 2004 now U.S. Pat. No. 7,195,958 for "Methods of Fabricating ESD Protection Structures," which application is a divisional of application Ser. No. 10/298,104, filed Nov. 14, 2002, now U.S. Pat. No. 6,777,721 for "SCR Device for ESD Protection." The '102 and '874 applications and the '721 patent are incorporated by reference herein in their entireties.

BACKGROUND OF THE INVENTION

Silicon-Controlled-Rectifier (SCR) devices are widely used for electrostatic discharge (ESD) protection because they have smaller size, lower holding voltage and lower capacitance than bipolar transistors. The smaller size is due to the higher current-carrying capability compared to bipolar transistors. The lower holding voltage is due to the interaction of the NPN and the PNP transistors in the SCR devices. The lower capacitance is due to the device structure and the smaller size.

Because of the smaller size, the SCR devices can be used to protect high-pin-count integrated circuits without significant die-size penalty. Because of the lower holding voltage, the power dissipation during an ESD event is minimized. This is critical for discharging the destructive current. Because of the lower capacitance, the SCR devices can be used to protect high-speed pins.

Unfortunately, SCR devices are known to be slower than bipolar transistors. As a result, while SCR devices are capable of protecting integrated circuits against the Human-Body-Model (HBM) ESD, they are not effective against the Charge-Device-Model (CDM) ESD which is much faster. Moreover, SCR devices are able to discharge pulses in only one direction.

SUMMARY OF THE PRESENT INVENTION

A preferred embodiment of the present invention comprises a pair of SCR devices connected in antiparallel between first and second nodes. Each SCR device comprises an NPN and a PNP bipolar transistor. Reverse-biased Zener diodes are used for triggering the NPN bipolar transistor in each SCR device when it breaks down in an ESD event. Advantageously, additional Zener diodes are provided for pre-charging the PNP transistor of each SCR device at the same time, thereby reducing the delay time for turning on the PNP bipolar transistor. In addition, the breakdown current of the Zener diodes is preferably maximized by reducing the P-well and N-well resistance of the SCRs. This is achieved by connecting external resistances between the base of each bipolar transistor and the node to which the emitter of the transistor is connected.

BRIEF DESCRIPTION OF THE DRAWINGS

These and other objects, features and advantages of the invention will be more readily apparent from the following Detailed Description in which.

DETAILED DESCRIPTION

Figure 1:
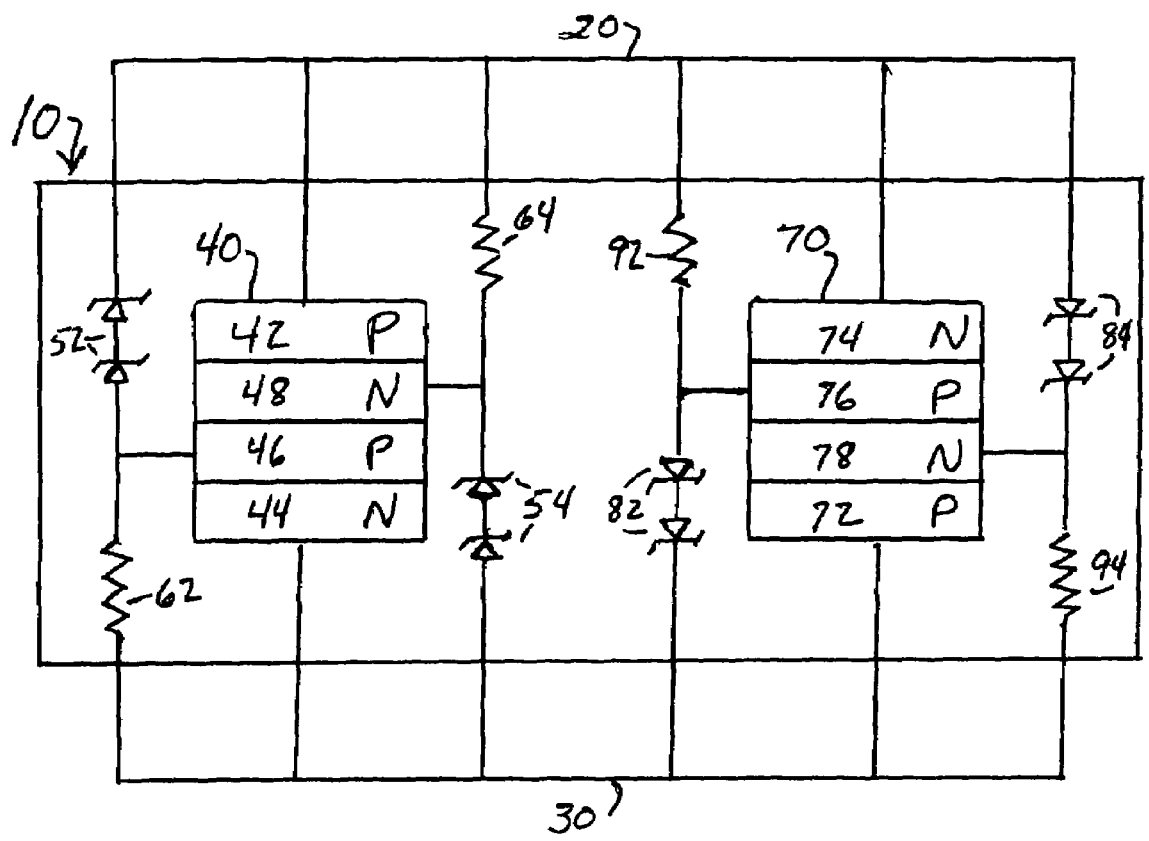
FIG. 1 is a schematic illustration of an embodiment of the invention.

FIG. 1 depicts an electrostatic discharge (ESD) protection device 10 for discharging either positive or negative electrostatic pulses on a first node 20 by rapidly connecting them to a second node 30 that typically is connected to ground. Device 10 comprises first and second PNPN devices 40, 70. Each PNPN device has an anode, a cathode, and first and second gates. For PNPN device 40, these elements are numbered 42, 44, 46, 48. For PNPN device 70, these elements are numbered 72, 74, 76, 78. As shown in FIG. 1, anode 42 of the first device is connected to first node 20 and cathode 44 is connected to second node 30. Anode 72 of the second device is connected to second node 30 and cathode 74 is connected to first node 20.

One or more Zener diodes 52 is connected between first gate 46 of the first PNPN device and first node 20; and one or more Zener diodes 54 is connected between second gate 48 and second node 30. For purposes of illustration, two pairs of series connected diodes 52, 54 are shown in FIG. 1 but it will be understood that a single diode could also be used or more than two diodes in place of each pair of diodes that is shown. Diodes 52 are connected so that their cathode is connected to first node 20 and their anode to first gate 46. Diodes 54 are connected so that their cathode is connected to second gate 48 and their anode to second node 30.

Figure 3:
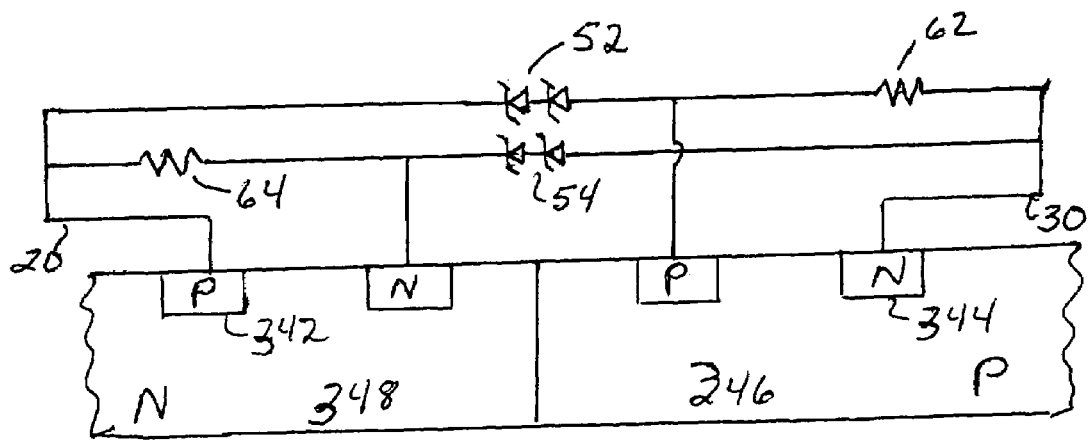
FIG. 3 is a cross-sectional view of a portion of the embodiment of FIG. 1.

FIG. 3 is a cross-section of an illustrative implementation of PNPN device 40 connected between first node 20 and second node 30. The device comprises a P or P+ region 342 formed in an N well 348 and an N or N+ region 344 formed in a P well 346 contiguous with N well 348. Regions 342 and 344 constitute the anode and cathode of the PNPN device and wells 346 and 348 correspond to first and second gates 46 and 48 of FIG. 1. The N region and N well are formed by doping with arsenic, phosphorus and/or other N-type dopant. The P region and P well are formed by doping with boron and/or other P-type dopants. Typical doping concentrations are $1 \times 10^{16}/cm^3$ to $1 \times 10^{18}/cm^3$ for N or P regions or wells and $1 \times 10^{17}/cm^3$ to $1 \times 10^{20}/cm^3$ for N+ or P+ regions.

Zener diodes 52, 54 are shown in FIG. 3 connected between first node 20 and P well 346 and between second node 30 and N well 348.

Advantageously, the P well and N well resistance is reduced so as to maximize the breakdown current of the Zener diodes. This is done by connecting an external resistance 62 in parallel with the P well 346 resistance and an external resistance 64 in parallel with the N well 348 resistance.

Returning to FIG. 1, one or more Zener diodes 82 is connected between first gate 76 of the second PNPN device 70 and the second node 30 and one or more Zener diodes 84 is connected between second gate 78 and first node 20. Again, two pairs of series connected diodes 82, 84 are shown in FIG. 1 but it will be understood that a single diode could also be used or more than two diodes in place of each pair of diodes that is shown. Diodes 82 are connected so that their cathode is connected to second node 30 and their anode to first gate 76. Diodes 84 are connected so that their cathode is connected to second gate 78 and their anode to first node 20.

Third and fourth resistors 92, 94 are connected between first gate 76 and first node 20 and between second gate 78 and second node 30, respectively, to reduce the P well and N well resistance of device 70, the same as was done in device 40.

Figure 2:
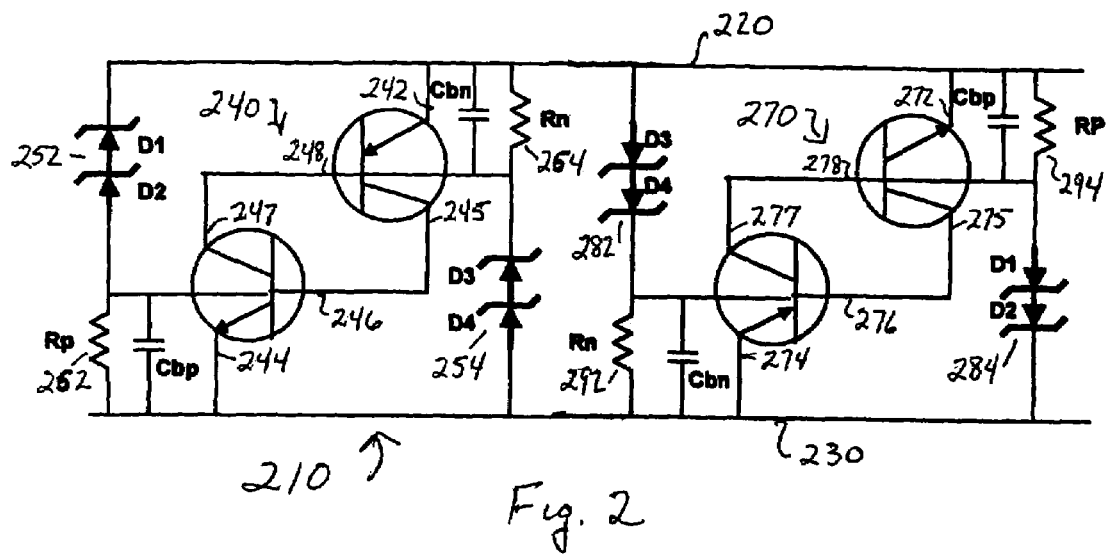
FIG. 2 is a circuit diagram of the embodiment of FIG. 1.

FIG. 2 is a circuit diagram of the device shown in FIG. 1. In this diagram each PNPN device of FIG. 1 is shown as a pair of transistors having an emitter, base and collector in which the bases and collectors of the two transistors are coupled together. ESD device 210 comprises first and second pairs of transistors 240, 270 coupled between a first node 220 and a second node 230. The first transistor of the first pair comprises an emitter 242, a base 248 and a collector 245. The second transistor comprises an emitter 244, a base 246 and a collector 247. The base and collector of the first transistor are connected to the collector and base, respectively, of the second transistor. Similarly, the first transistor of the second pair comprises an emitter 272, a base 278 and a collector 275. The second transistor comprises an emitter 274, a base 276 and a collector 277. Again the base and collector of the first transistor of the second pair are connected to the collector and base, respectively, of the second transistor of the second pair.

Emitter 242 is connected to first node 220 and emitter 244 is connected to second node 230. Emitter 272 is connected to second node 230 and emitter 274 is connected to first node 220.

One or more Zener diodes 252 is connected between base 246 and first node 220; and one or more Zener diodes 254 is connected between base 248 and second node 230. As in the case of FIG. 1, it will be understood that a single diode could also be used or more than two diodes in place of each pair of diodes that is shown. Diodes 252 are connected so that their cathode is connected to first node 220 and their anode to base 246. Diodes 254 are connected so that their cathode is connected to base 248 and their anode to second node 230.

First and second resistors 252, 254 are connected between base 246 and second node 230 and between base 248 and first node 220, respectively. Resistors 252, 254 correspond to resistors 52, 54 of FIG. 1. Resistor 252 is connected in parallel with the well resistance between base 246 of the NPN transistor and node 230 while resistor 254 is connected in parallel with the well resistance between base 248 of the PNP transistor and node 220.

One or more Zener diodes 282 is connected between base 276 and second node 230 and one or more Zener diodes 284 is connected between base 278 and first node 220. Again, it will be understood that a single diode could also be used or more than two diodes in place of each pair of diodes that is shown. Diodes 282 are connected so that their cathode is connected to second node 230 and their anode to base 276. Diodes 284 are connected so tha their cathode is connected to base 278 and their anode to first node 220.

Third and fourth resistors 292, 294 are connected between base 276 and first node 220 and between base 278 and second node 230, respectively. Resistors 292, 294 correspond to resistors 92, 94 of FIG. 1.

The turn-on of the SCR devices is made faster by using the reverse-biased Zener diodes. For example, Zener diodes 252 trigger the NPN bipolar transistor when they break down in an ESD event. Zener diodes 254 pre-charge the PNP bipolar transistor at the same time, reducing the delay time of turning on the PNP bipolar transistor.

Zener diodes have the advantage of much higher substrate doping and thus much lower series resistance. Several Zener diodes can be stacked together as required, and the total series resistance can still be made small. Due to smaller series resistance, the bases of the bipolar transistors can be charged up faster for turning on the bipolar transistors. The stacked Zener diodes also reduce the pin capacitance and the pin leakage.

As will be apparent to those skilled in the art, numerous variations may be made in the above-described circuitry within the spirit and scope of the invention.

What is claimed is:

1. An electrostatic discharge (ESD) protection device comprising:
    a first semiconductor controlled rectifier (SCR) having first and second gates, an anode and a cathode wherein the anode is connected to a first node and the cathode is connected to a second node;
    at least a first Zener diode having a cathode connected to the first node and an anode connected to the first gate of the first SCR;
    a second SCR having first and second gates, an anode and a cathode wherein the anode is connected to the second node and the cathode is connected to the first node;
    at least a second Zener diode having a cathode connected to the second node and an anode connected to the first gate of the second SCR; and
    at least a third Zener diode having a cathode connected to the second gate of the first SCR and an anode connected to the second node.

2. The ESD protection device of claim 1 further comprising a plurality of Zener diodes connected in series between the first node and the first gate of the first SCR.

3. The ESD protection device of claim 1 further comprising a plurality of Zener diodes connected in series between the second node and the first gate of the second SCR.

4. The ESD protection device of claim 1 further comprising a plurality of Zener diodes connected in series between the second gate of the first SCR and the second node.

5. The ESD protection device of claim 1 further comprising at least a fourth Zener diode having a cathode connected to the second gate of the second SCR and an anode connected to the first node.

6. The ESD protection device of claim 5 further comprising a plurality of Zener diodes connected in series between the second gate of the second SCR and the first node.

7. The ESD protection device of claim 1 further comprising a first resistor connected between the first gate of the first SCR and the second node.

8. The ESD protection device of claim 1 further comprising a second resistor connected between the first gate of the second SCR and the first node.

9. The ESD protection device of claim 1 further comprising:
    at least a fourth Zener diode having a cathode connected to the second gate of the second SCR and an anode connected to the first node;
    a first resistor connected between the first gate of the first SCR and the second node; and
    a second resistor connected between the first gate of the second SCR and the first node.

10. The ESD protection device of claim 1 further comprising:
    a plurality of Zener diodes connected in series between the first node and the first gate of the first SCR;
    a plurality of Zener diodes connected in series between the second node and the first gate of the second SCR;
    a plurality of Zener diodes connected in series between the second gate of the first SCR and the second node, and
    a plurality of Zener diodes connected in series between the second gate of the second SCR and the first node.

11. The ESD protection device of claim 1 wherein the first node is connected to an input/output pad and the second node is connected to ground.

12. An electrostatic discharge (ESD) protection device comprising:
- a first semiconductor controlled rectifier (SCR) comprising a first transistor comprising an emitter, a base and collector and a second transistor comprising an emitter, a base and a collector wherein the base of the first transistor is connected to the collector of the second transistor and the base of the second transistor is connected to the collector of the first transistor;
- a second SCR comprising a third transistor comprising an emitter, a base and a collector and a fourth transistor comprising an emitter, a base and a collector wherein the base of the third transistor is connected to the collector of the fourth transistor and the base of the fourth transistor is connector to the collector of the third transistor;
- the emitter of the first transistor being connected to a first node and the emitter of second transistor being connected to a second node;
- at least a first Zener diode having a cathode connected to the first node and an anode connected to the base of the second transistor;
- the emitter of the third transistor being connected to the second node and the emitter of the fourth transistor being connected to the first node,
- at least a second Zener diode having a cathode connected to the second node and an anode connected to the base of the fourth transistor; and
- at least a third Zener diode having a cathode connected to the second gate of the first SCR and an anode connected to the second node.

13. The ESD protection device of claim 12 wherein the first and third transistors are PNP transistors and the second and fourth transistors are NPN transistors.

14. The ESD protection device of claim 12 further comprising at least a fourth Zener diode having a cathode connected to the second gate of the second SCR and an anode connected to the first node.

15. The ESD protection device of claim 12 further comprising a second resistor connected between the first gate of the second SCR and the first node.

16. The ESD protection device of claim 12 further comprising:
- at least a fourth Zener diode having a cathode connected to the second gate of the second SCR and an anode connected to the first node;
- a first resistor connected between the first gate of the first SCR and the second node; and
- a second resistor connected between the first gate of the second SCR and the first node.

17. An electrostatic discharge (ESD) protection device comprising:
- a first PNPN device having an anode connected to a first node and a cathode connected to a second node;
- a second PNPN device having an anode connected to the second node and a cathode connected to the first node;
- at least a first Zener diode having a cathode connected to the first node and an anode connected to a first gate of the first PNPN device;
- at least a second Zener diode having a cathode connected to the second node and an anode connected to a first gate of the second PNPN device; and
- at least a third Zener diode having a cathode connected to the second gate of the first PNPN device and an anode connected to the second node.

18. The ESD protection device of claim 17 further comprising:
- at least a fourth Zener diode having a cathode connected to the second gate of the second PNPN device and an anode connected to the first node;
- a first resistor connected between the first gate of the first PNPN device and the second node; and
- a second resistor connected between the first gate of the second PNPN device and the first node.

19. The ESD protection device of claim 17 further comprising:
- a plurality of Zener diodes connected in series between the first node and the first gate of the first PNPN device;
- a plurality of Zener diodes connected in series between the second node and the first gate of the second PNPN device;
- a plurality of Zener diodes connected in series between the second gate of the first PNPN device and the second node, and
- a plurality of Zener diodes connected in series between the second gate of the second PNPN device and the first node.

20. An electrostatic discharge (ESD) protection device comprising first and second circuits connected between a signal lead and ground,
said first structure comprising:
- a first PNP transistor having an emitter, a base and a collector, the emitter being connected to the signal lead;
- a first NPN transistor having an emitter, a base and a collector, the emitter being connected to ground;
- the base of the first PNP transistor being connected to the collector of the first NPN transistor and the base of the first NPN transistor being connected to the collector of the first PNP transistor;
- a first reverse-biased Zener diode being connected between the base of the first NPN transistor and the emitter of the first PNP transistor; and
- a second reverse-biased Zener diode being connected between the base of the first PNP transistor and the emitter of the first NPN transistor; and said second structure comprising:
- a second PNP transistor having an emitter, a base and a collector, the emitter being connected to ground;
- a second NPN transistor having an emitter, a base and a collector, the emitter being connected to the signal lead;
- the base of the second PNP transistor being connected to the collector of the second NPN transistor and the base of the second NPN transistor being connected to the collector of the second PNP transistor;
- a third reverse-biased Zener diode being connected between the base of the second NPN transistor and the emitter of the second PNP transistor; and
- a fourth reverse-biased Zener diode being connected between the base of the second PNP transistor and the emitter of the second NPN transistor.

* * * * *